United States Patent
Osawa

(10) Patent No.: US 12,322,532 B2
(45) Date of Patent: Jun. 3, 2025

(54) SHUNT RESISTOR AND CURRENT DETECTION APPARATUS

(71) Applicant: KOA CORPORATION, Ina (JP)

(72) Inventor: Ryou Osawa, Ina (JP)

(73) Assignee: KOA CORPORATION, Ina (JP)

( * ) Notice: Subject to any disclaimer, the term of this patent is extended or adjusted under 35 U.S.C. 154(b) by 304 days.

(21) Appl. No.: 18/079,245

(22) Filed: Dec. 12, 2022

(65) Prior Publication Data

US 2023/0187105 A1 Jun. 15, 2023

(30) Foreign Application Priority Data

Dec. 14, 2021 (JP) ................... 2021-202176

(51) Int. Cl.
| | |
|---|---|
| *H01C 1/14* | (2006.01) |
| *G01R 1/20* | (2006.01) |
| *G01R 19/00* | (2006.01) |
| *H01C 1/014* | (2006.01) |

(52) U.S. Cl.
CPC ............... *H01C 1/14* (2013.01); *G01R 1/203* (2013.01); *G01R 19/0092* (2013.01); *H01C 1/014* (2013.01)

(58) Field of Classification Search
CPC .......... H01C 1/14; H01C 1/014; G01R 1/203; G01R 19/0092
See application file for complete search history.

(56) References Cited

U.S. PATENT DOCUMENTS

| | | | |
|---|---|---|---|
| 9,437,353 B2* | 9/2016 | Hetzler | H01C 7/13 |
| 10,564,188 B2* | 2/2020 | Kameko | G01R 1/067 |
| 11,791,073 B2* | 10/2023 | Ashida | H01C 13/00 |
| | | | 338/315 |
| 11,821,922 B2* | 11/2023 | Thumm | G01R 1/203 |
| 2012/0154104 A1* | 6/2012 | Hetzler | H01C 1/14 |
| | | | 29/874 |
| 2015/0041200 A1* | 2/2015 | Hetzler | H05K 1/0212 |
| | | | 29/840 |

FOREIGN PATENT DOCUMENTS

| | | |
|---|---|---|
| JP | 2007-329421 A | 12/2007 |
| JP | 2013-504213 A | 2/2013 |
| JP | 2020-102626 A | 7/2020 |

\* cited by examiner

*Primary Examiner* — Kyung S Lee
(74) *Attorney, Agent, or Firm* — WHDA, LLP

(57) ABSTRACT

A shunt resistor capable of reducing an absolute value of a temperature coefficient of resistance is disclosed. The shunt resistor includes: a base structure including a resistance element and a pair of electrodes; a bridge structure configured to bridge the pair of electrodes and made of a conductor; and connections configured to couple the pair of electrodes to the bridge structure. The bridge structure has a higher resistance than a resistance of the base structure at the connections.

7 Claims, 17 Drawing Sheets

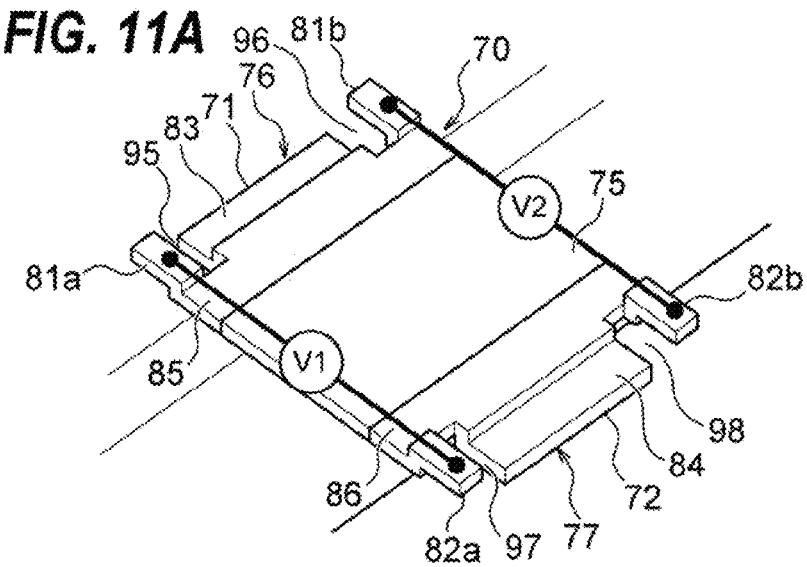
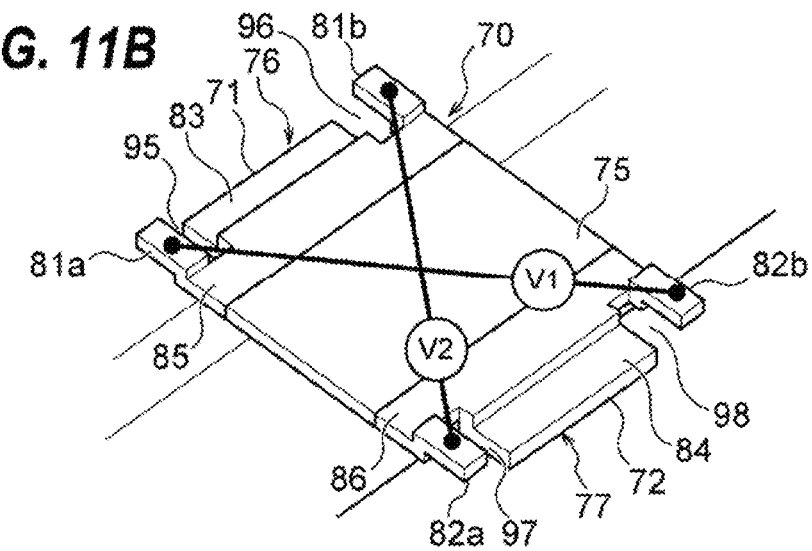
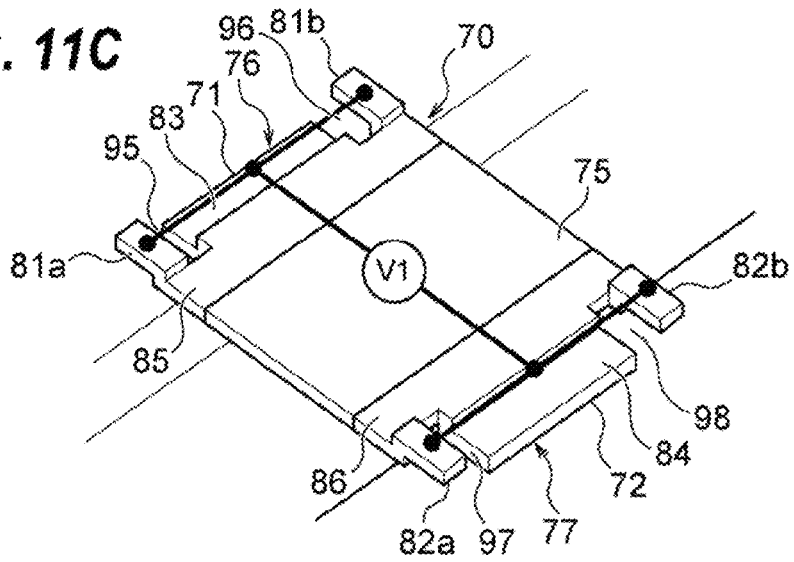

SHUNT RESISTOR AND CURRENT DETECTION APPARATUS

CROSS REFERENCE TO RELATED APPLICATION

This document claims priority to Japanese Patent Application No. 2021-202176 filed Dec. 14, 2022, the entire contents of which are hereby incorporated by reference.

BACKGROUND

A shunt resistor is widely used in current detecting applications. Such a shunt resistor includes a resistance element and electrodes joined to both ends of the resistance element. In general, the resistance element is made of resistance alloy, such as copper-nickel alloy, copper-manganese alloy, iron-chromium alloy, or nickel-chromium alloy. The electrodes are made of highly conductive metal, such as copper. Voltage detecting portions are provided in the electrodes, and conductive wires (e.g., aluminum wires) are coupled to the voltage detecting portions, so that a voltage between the voltage detecting portions is detected.

Characteristics of a temperature coefficient of resistance (TCR) are important in the shunt resistor in order to allow for current detection under conditions where effects of temperature fluctuation are small. The temperature coefficient of resistance is an index that indicates a rate of change in resistance due to temperature change, and the smaller an absolute value thereof the smaller change in resistance.

SUMMARY

Therefore, there are provided a shunt resistor and a current detection apparatus capable of reducing an absolute value of a temperature coefficient of resistance.

Embodiments, which will be described below, relate to a shunt resistor and a current detection apparatus.

In an embodiment, there is provided a shunt resistor for use in current detection. The shunt resistor comprises: a base structure including a resistance element and a pair of electrodes coupled to both ends of the resistance element; a bridge structure configured to bridge the pair of electrodes and made of a conductor; and connections configured to couple the pair of electrodes to the bridge structure. The bridge structure has a higher resistance than a resistance of the base structure at the connections.

In an embodiment, the bridge structure has a smaller size than a size of the base structure.

In an embodiment, the connections are arranged along joint portions between the pair of electrodes and the resistance element.

In an embodiment, the bridge structure includes voltage detecting portions arranged at both end-portion sides of the bridge structure.

In an embodiment, the bridge structure includes slit portions arranged between the connections and the voltage detecting portions.

In an embodiment, the shunt resistor comprises voltage detecting portions arranged next to the connections.

In an embodiment, the bridge structure has a plate shape and is bent in a direction perpendicular to a length direction of the resistance element.

In an embodiment, there is provided a current detection apparatus comprising: the above-described shunt resistor; and a current-detecting circuit board having a voltage signal wire configured to transmit a voltage signal from the shunt resistor. The bridge structure includes voltage detecting portions arranged at both end-portion sides of the bridge structure, and the current-detecting circuit board incudes voltage terminal pads coupled to the voltage detecting portions.

The shunt resistor includes the base structure having the resistance element and the pair of electrodes, and the bridge structure having a higher resistance than the resistance of the base structure at the connections. The shunt resistor having such a structure can reduce the absolute value of the temperature coefficient of resistance thereof.

BRIEF DESCRIPTION OF THE DRAWINGS

FIGS. 11A to 11C are diagrams showing examples of methods of determining a detected voltage value;

DESCRIPTION OF EMBODIMENTS

Figure 1:
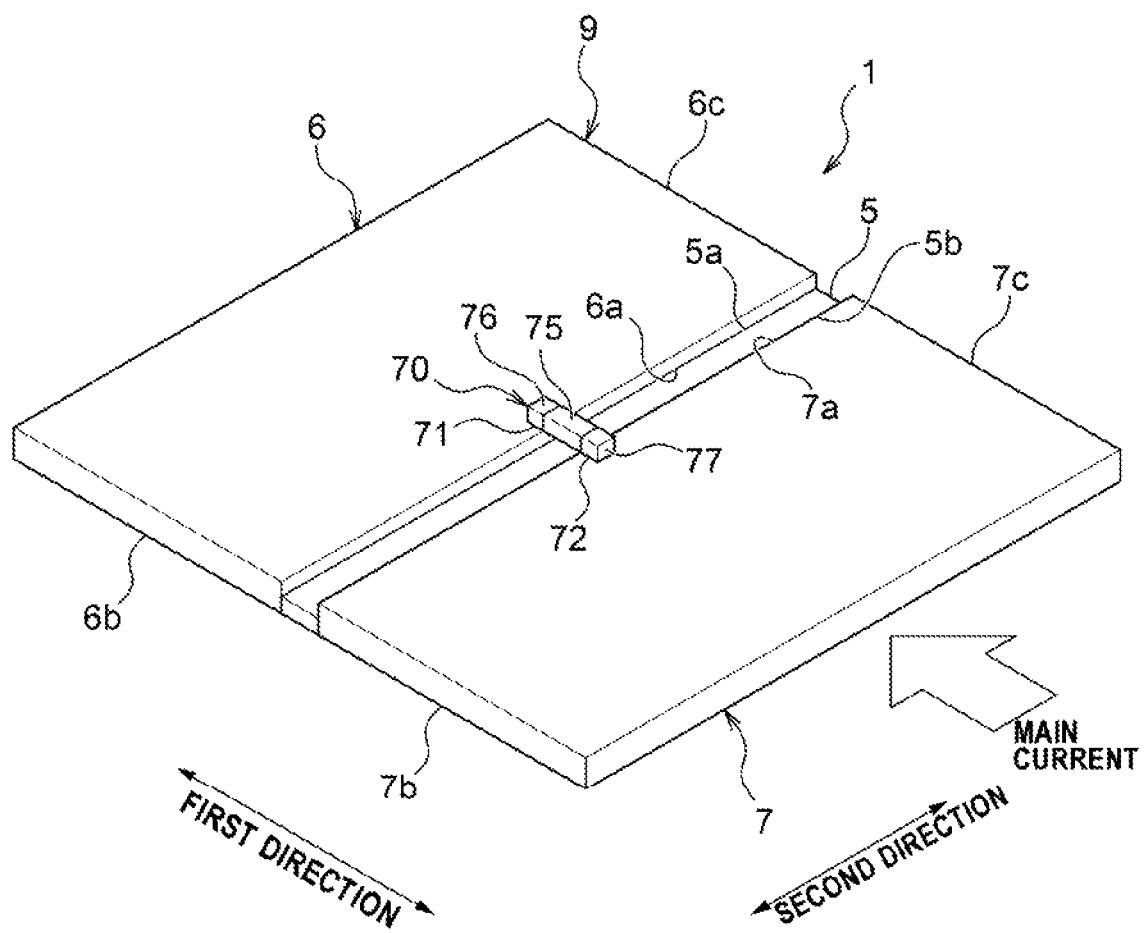
FIG. 1 is a diagram showing an embodiment of a shunt resistor.

Hereinafter, embodiments will be described with reference to the drawings. In the drawings described below, identical or corresponding components will be denoted by identical reference numerals, and repetitive descriptions thereof are omitted. In the multiple embodiments described below, configurations of one embodiment, which will not be particularly described, are the same as those of other embodiments, and duplicated descriptions will be omitted.

FIG. 1 is a diagram showing an embodiment of a shunt resistor. As shown in FIG. 1, the shunt resistor 1 includes a resistance element 5 made of a resistance alloy plate material having a predetermined thickness and a predetermined width, and a pair of electrodes 6 and 7 which are coupled to both ends (i.e., both side connecting surfaces) 5a and 5b of the resistance element 5 in a first direction and are made of highly conductive metal. The resistance element 5 and the pair of electrodes 6 and 7 constitute a base structure 9.

The electrode 6 has a contact surface 6a that contacts one end (one connecting surface) 5a of the resistance element 5, and the electrode 7 has a contact surface 7a that contacts the other end (other connecting surface) 5b of the resistance element 5. Bolt holes (not shown) for coupling the shunt resistor 1 to not-shown wiring members (e.g., bus bars) with screws or the like are formed in the electrodes 6 and 7, respectively.

As shown in FIG. 1, the first direction is a length direction of the resistance element 5 and corresponds to a length direction of the shunt resistor 1. The length direction of the shunt resistor 1 is a direction in which the electrode 6, the resistance element 5, and the electrode 7 are arranged in this order. A direction perpendicular to this first direction is a second direction. The second direction is a width direction of the shunt resistor 1. As shown in FIG. 1, the electrodes 6 and 7 have the same structure and are arranged symmetrically with respect to the resistance element 5.

Each of the ends 5a and 5b of the resistance element 5 is coupled (joined) to each of the electrodes 6 and 7 by means of welding (e.g., electron beam welding, laser beam welding, brazing, or soldering). An example of a material of the resistance element 5 is low-resistance alloy material, such as Cu—Mn alloy. An example of a material of the electrodes 6 and 7 is copper (Cu). The resistance element 5 has a higher resistivity than those of the electrodes 6 and 7.

The shunt resistor 1 further includes a bridge structure 70 configured to bridge the pair of electrodes 6 and 7. The bridge structure 70 is made of a conductor. The shunt resistor 1 further includes connections 71 and 72 that couple the pair of electrodes 6 and 7 to the bridge structure 70. The connection 71 couples the electrode 6 to the bridge structure 70 by means of welding (e.g., electron beam welding, laser beam welding, brazing, or soldering). Similarly, the connection 72 couples the electrode 7 to the bridge structure 70 by means of welding (e.g., electron beam welding, laser beam welding, brazing, or soldering).

The bridge structure 70 is arranged above the resistance element 5 so as to straddle the electrodes 6 and 7. The shunt resistor 1 including the bridge structure 70 is configured to shunt a part of a main current (see FIG. 1) passing through the shunt resistor 1.

The bridge structure 70 has a higher resistance than resistance of the base structure 9 at the connections 71 and 72 (i.e., resistance of the bridge structure 70 at the connections 71 and 72>the resistance of the base structure 9 at the connections 71 and 72). The bridge structure 70 has a smaller size than a size of the base structure 9. In the embodiment shown in FIG. 1, the bridge structure 70 includes a resistance portion 75 made of the same material as the resistance element 5 (e.g., low resistance alloy), and a pair of electrode portions 76 and 77 coupled to both ends of the resistance portion 75. The electrode portions 76 and 77 are made of the same material as the electrodes 6 and 7 (e.g., copper). The resistance portion 75 has a higher resistivity than those of the electrode portions 76 and 77. In one embodiment, the bridge structure 70 may be made of a single conductor, such as copper. The resistance portion 75 may be made of a material different from that of the resistance element 5, and the electrode portions 76 and 77 may be made of a material different from those of the electrodes 6 and 7.

The electrode portion 76, the resistance portion 75, and the electrode portion 77 are arranged in this order in the first direction of the shunt resistor 1. The resistance portion 75 is coupled (joined) to each of the electrode portions 76 and 77 by means of welding (e.g., electron beam welding, laser beam welding, brazing, or soldering).

In the embodiment shown in FIG. 1, the electrode portions 76 and 77 correspond to voltage detecting portions for detecting a voltage between the pair of electrode portions 76 and 77. In other words, the electrode portions 76 and 77 include voltage detecting portions. In one embodiment, the connections 71 and 72 may correspond to voltage detecting portions. In one embodiment, the electrodes 6 and 7 next to the connections 71 and 72 may correspond to voltage detecting portions.

Figure 2:
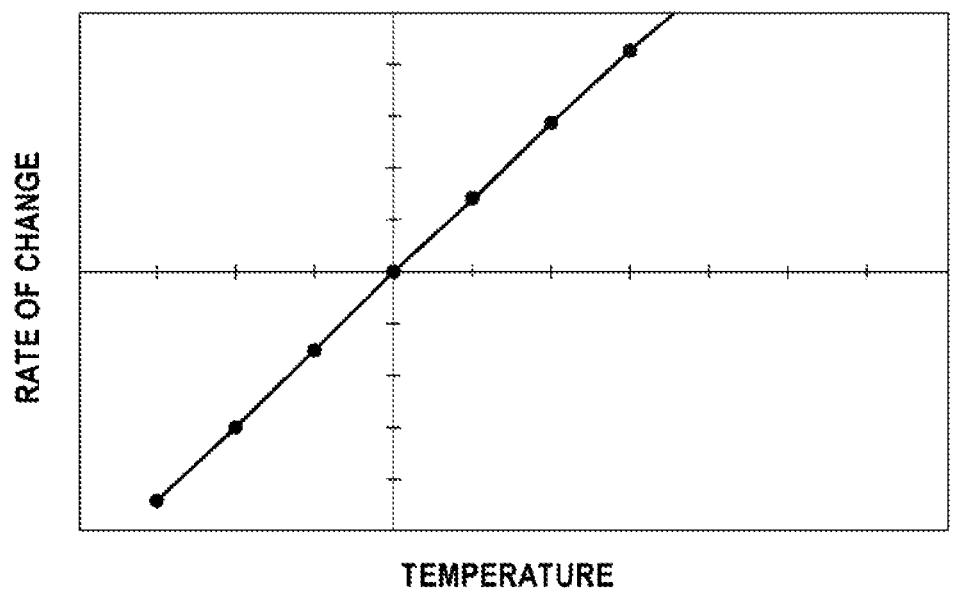
FIG. 2 is a graph showing a rate of change in resistance of a shunt resistor, which does not have a bridge structure, with temperature change, as a comparative example.
Figure 3:
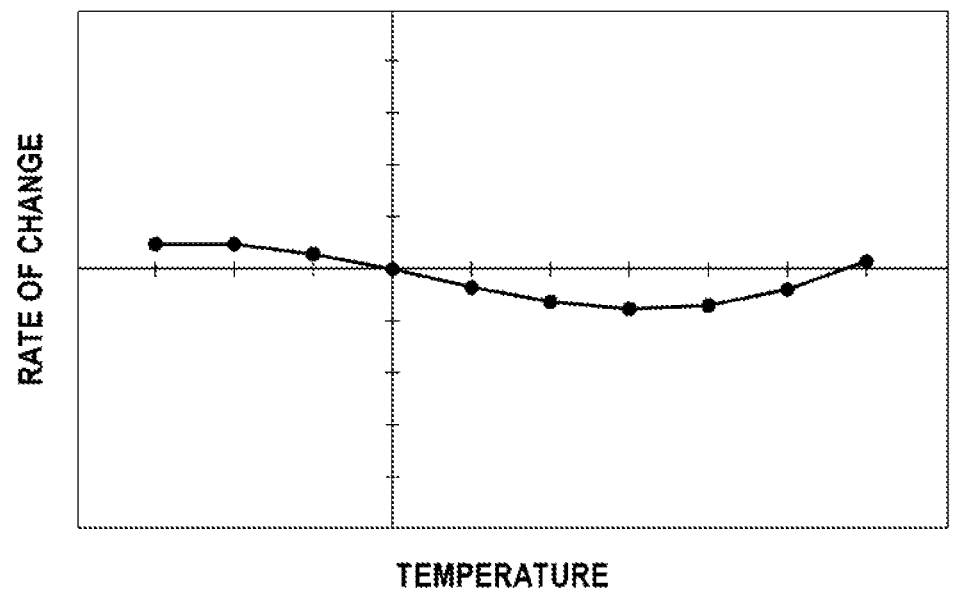
FIG. 3 is a graph showing a rate of change in resistance of the shunt resistor according to the embodiment with temperature change.

FIG. 2 is a graph showing a rate of change in resistance of a shunt resistor, which does not have a bridge structure, with temperature change, as a comparative example. FIG. 3 is a graph showing a rate of change in resistance of the shunt resistor according to this embodiment with temperature change. In each of FIGS. 2 and 3, horizontal axis represents the temperature of the shunt resistor, and vertical axis represents the rate of change in resistance of the shunt resistor.

As can be clearly seen from comparison between the rate of change in resistance of the shunt resistor 1 according to the present embodiment and the rate of change in resistance of the shunt resistor as the comparative example, the shunt resistor 1 of the present embodiment can reduce the rate of change in resistance due to temperature change. Thus, the shunt resistor 1 including the bridge structure 70 can reduce an absolute value of a temperature coefficient of resistance (TCR).

Figure 4:
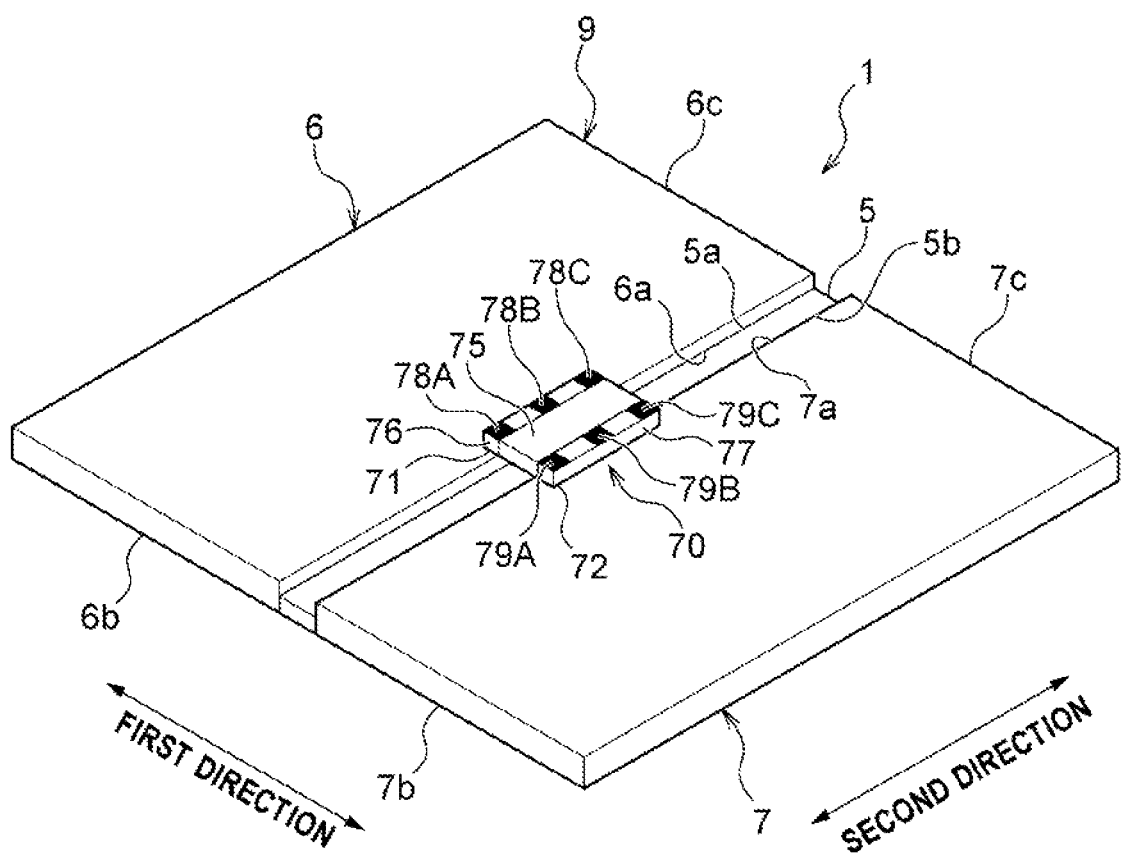
FIG. 4 is a diagram showing another embodiment of the bridge structure.

FIG. 4 is a diagram showing another embodiment of the bridge structure. As shown in FIG. 4, the bridge structure 70 may have a wide shape whose size is elongated in the second direction. With such a configuration, each of the electrode portions 76 and 77 of the bridge structure 70 can have a plurality of voltage detecting portions.

In the embodiment shown in FIG. 4, the electrode portion 76 includes voltage detecting portions 78A, 78B, and 78C arranged along joint portions (i.e., the contact surfaces 6a and 7a) of the electrodes 6 and 7 with the resistance element 5. Similarly, the electrode portion 77 includes voltage detecting portions 79A, 79B, and 79C arranged along joint portions (i.e., the contact surfaces 6a and 7a) of the electrodes 6 and 7 with the resistance element 5. Thus, the voltage detecting portions 78A to 78C and the voltage detecting portions 79A to 79C are arranged along the second direction of the shunt resistor 1.

In the embodiment shown in FIG. 1, the connections 71 and 72 of the bridge structure 70 are arranged in a central portion of the resistance element 5 in the second direction of the shunt resistor 1. In one embodiment, the connections 71 and 72 may be arranged along joint portions (i.e., the contact surfaces 6a and 7a) of the pair of electrodes 6 and 7 with the resistance element 5. In other words, the bridge structure 70 may be arranged adjacent to the resistance element 5 in the second direction of the shunt resistor 1. Hereinafter, other arrangement examples of the bridge structure 70 will be described below with reference to the drawings.

Figure 5:
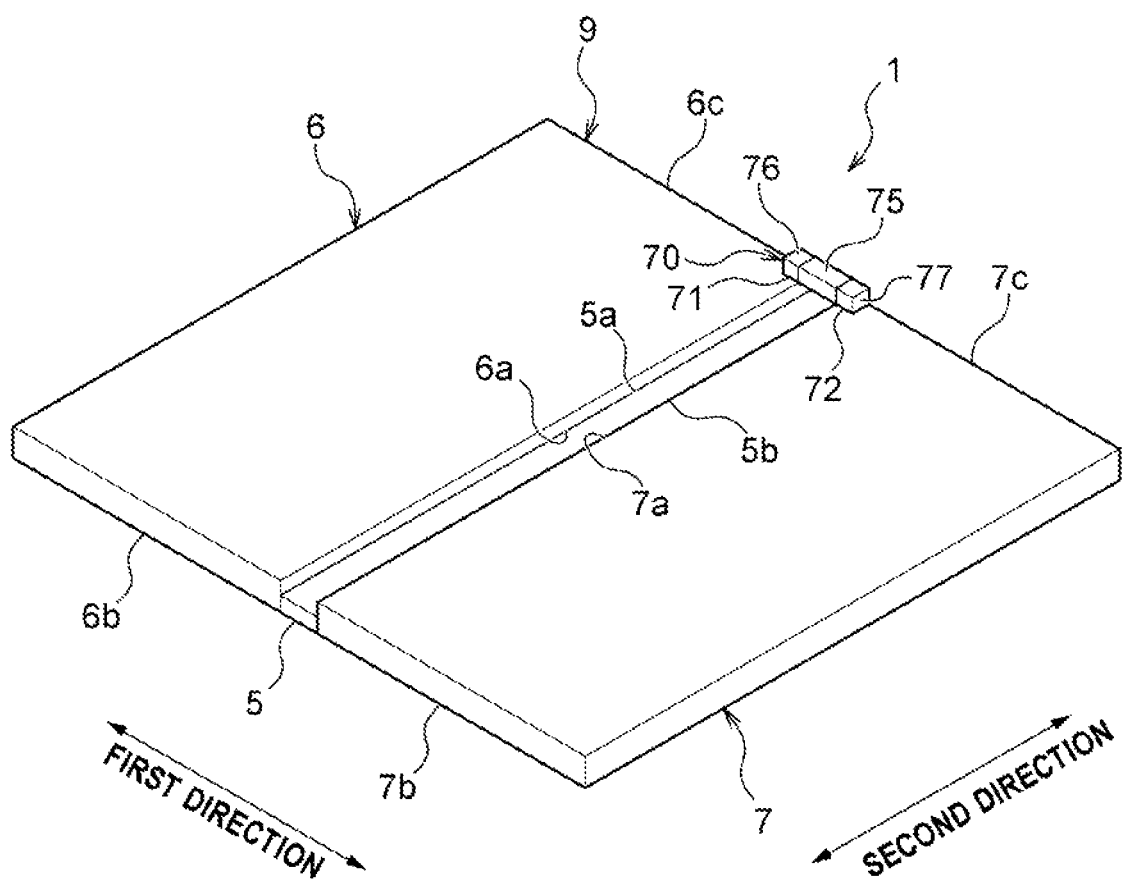
FIG. 5 is a diagram showing another embodiment of the shunt resistor including the bridge structure.
Figure 6:
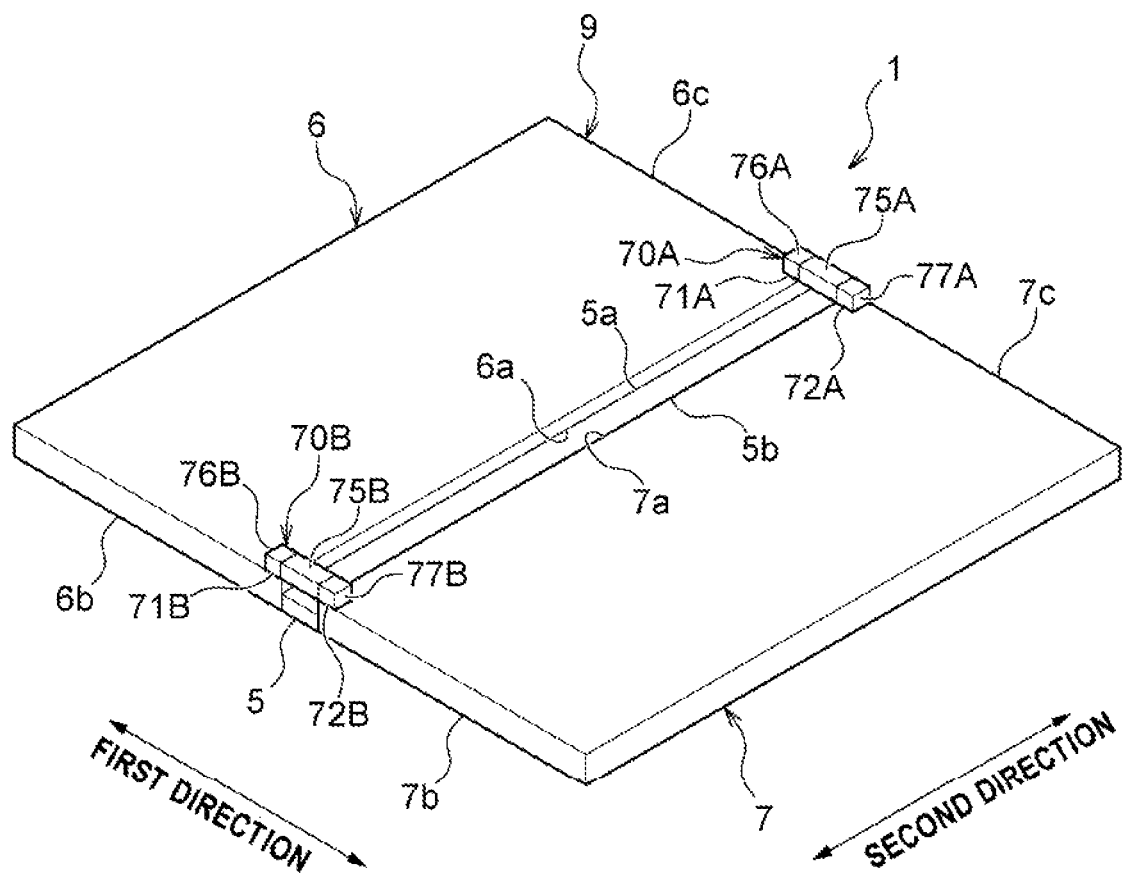
FIG. 6 is a diagram showing another embodiment of the shunt resistor including the bridge structure.
Figure 7:
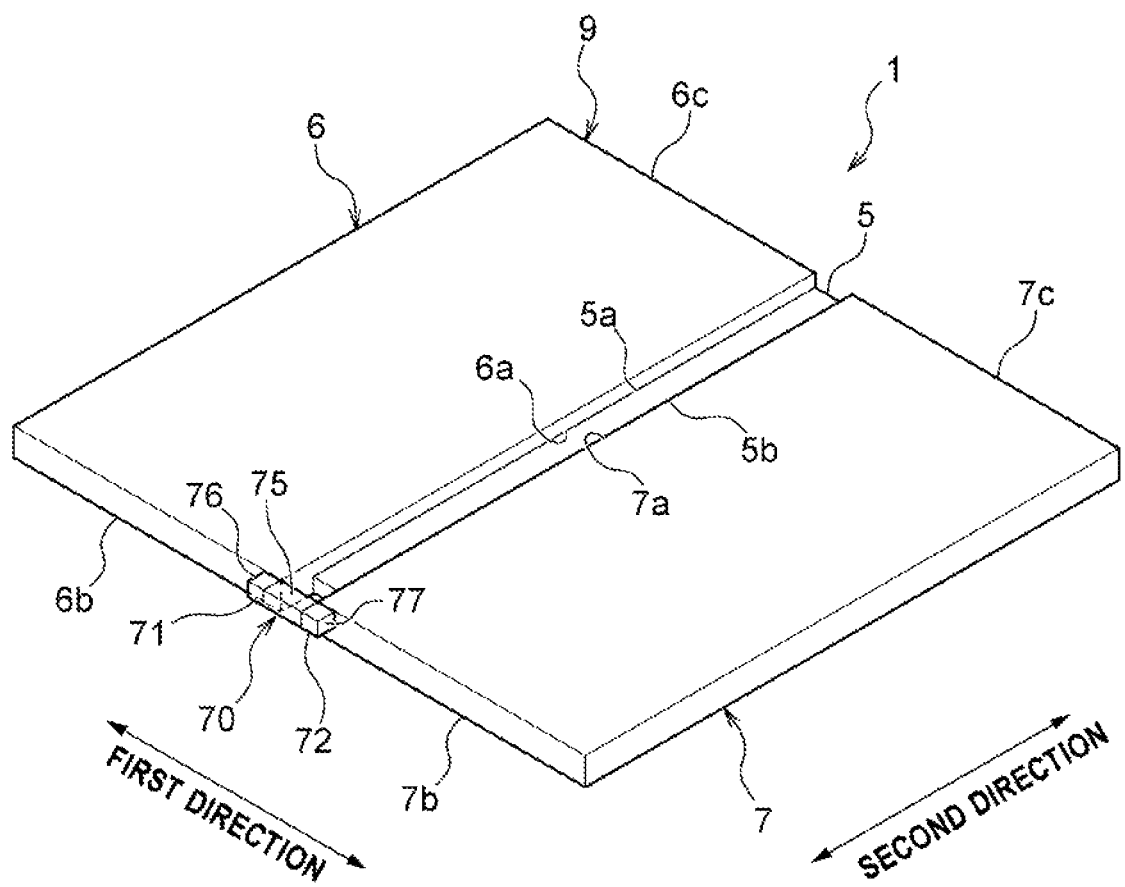
FIG. 7 is a diagram showing another embodiment of the shunt resistor including the bridge structure.

FIGS. 5 to 7 is diagrams showing other embodiments of the shunt resistor including the bridge structure. As shown in FIG. 5, the bridge structure 70 may be coupled to side surfaces 6c and 7c of the electrodes 6 and 7 in the second direction. In the embodiment shown in FIG. 5, the bridge structure 70 coupled to the side surfaces 6c and 7c in the second direction is arranged above the resistance element 5.

In the embodiment shown in FIG. 6, the shunt resistor 1 includes a bridge structure 70A coupled to the side surfaces 6c and 7c of the electrodes 6 and 7 in the second direction, and a bridge structure 70B coupled to side surfaces 6b and 7b of the electrodes 6 and 7 in the second direction. The bridge structures 70A and 70B are arranged above the resistance element 5.

The bridge structure 70A includes a resistance portion 75A and a pair of electrode portions 76A and 77A, and is coupled to the pair of electrodes 6 and 7 by connections 71A and 72A. Similarly, the bridge structure 70B includes a resistance portion 75B and a pair of electrode portions 76B and 77B, and is coupled to the pair of electrodes 6 and 7 by connections 71B and 72B. Thus, in the embodiment shown in FIG. 6, the bridge structures 70A and 70B have the same structure as each other.

In the embodiment shown in FIG. 7, the bridge structure 70 coupled to the side surfaces 6b and 7b of the electrodes 6 and 7 is arranged laterally of the resistance element 5. A gap is formed between the resistance portion 75 of the bridge structure 70 and the resistance element 5. Although not shown, the bridge structure 70 may be coupled to the side surfaces 6c and 7c of the electrodes 6 and 7. Although not shown, the embodiment shown in FIG. 7 may be combined with the embodiment shown in FIG. 5 and/or the embodiment shown in FIG. 6.

In the embodiments shown in FIGS. 1 to 6, the bridge structure 70 is arranged at a front side of the resistance element 5, while in one embodiment, the bridge structure 70 may be arranged at a back side of the resistance element 5.

Figure 8A:
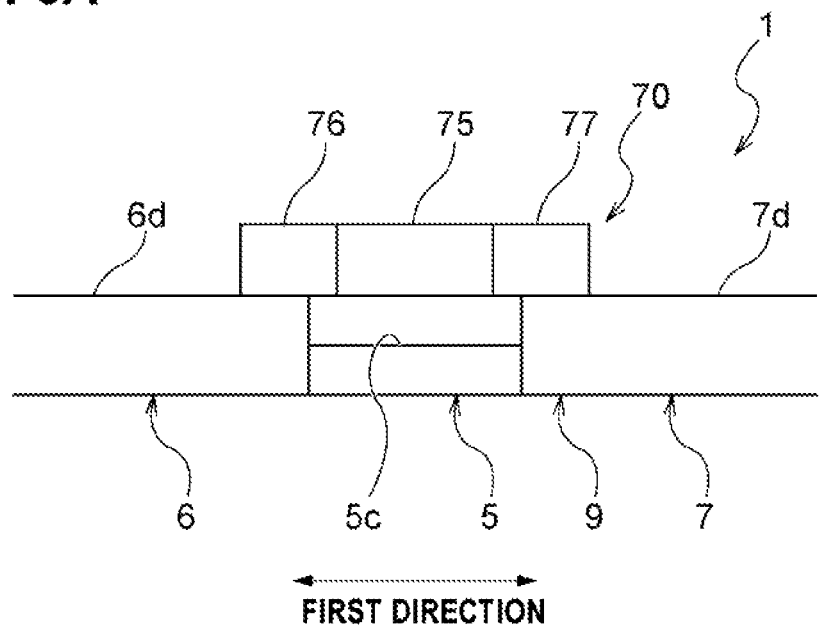
FIG. 8A is a diagram showing a bridge structure having a linear shape.
Figure 8B:
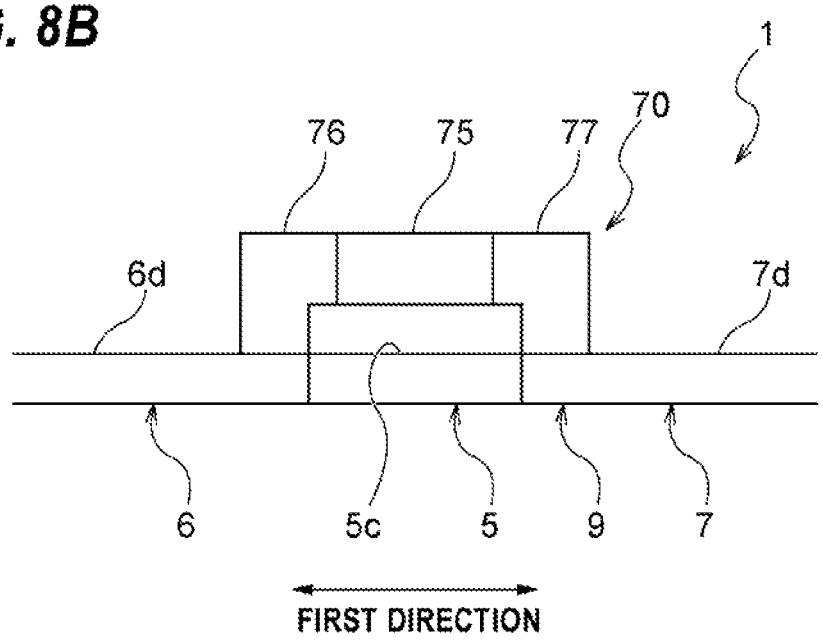
FIG. 8B is a diagram showing a bridge structure having an arch shape.

FIG. 8A is a diagram showing a bridge structure having a linear shape, and FIG. 8B is a diagram showing a bridge structure having an arch shape. The bridge structure 70 according to the embodiment shown in FIG. 8A corresponds to the bridge structure 70 according to the embodiments shown in FIGS. 1 to 7. In the embodiment shown in FIG. 8A, the bridge structure 70 has a linear shape. An upper surface 5c of the resistance element 5 is located lower than upper surfaces 6d and 7d of the electrodes 6 and 7. Therefore, the linear-shaped bridge structure 70 is arranged above the upper surface 5c of the resistance element 5. As a result, a gap is formed between the resistance portion 75 of the bridge structure 70 and the resistance element 5, and the bridge structure 70 is not in contact with the resistance element 5.

As shown in FIG. 8B, the upper surface 5c of the resistance element 5 is arranged at the same height as those of the upper surfaces 6d and 7d of the electrodes 6 and 7. The bridge structure 70 has a plate shape and is curved into a bridge shape. More specifically, the bridge structure 70 has an arch shape that curves away from the upper surface 5c of the resistance element 5. Therefore, the bridge structure 70 is arranged above the upper surface 5c of the resistance element 5, and a gap is formed between the resistance portion 75 of the bridge structure 70 and the resistance element 5.

Figure 9:
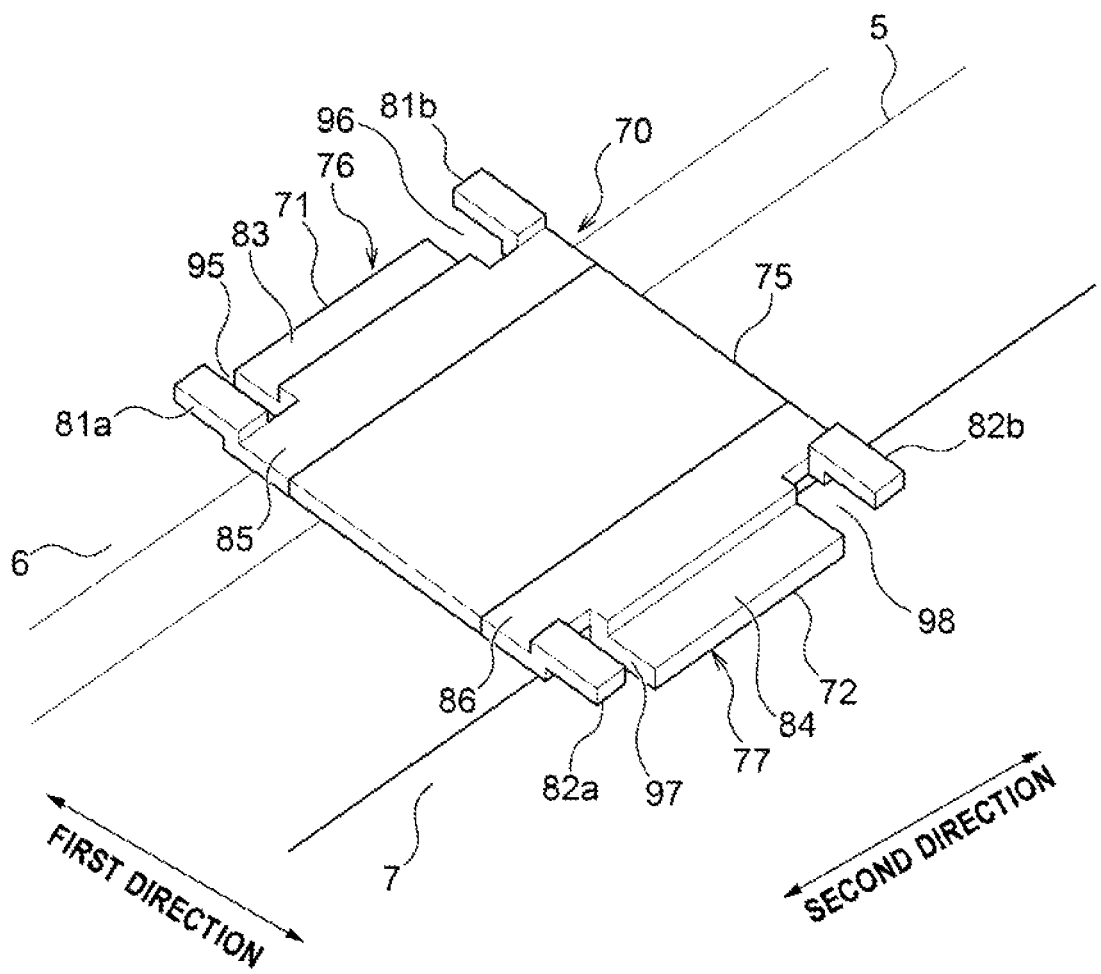
FIG. 9 is a diagram showing another embodiment of the bridge structure.

FIG. 9 is a diagram showing another embodiment of the bridge structure. As shown in FIG. 9, the bridge structure 70 includes voltage detecting portions 81a, 81b, 82a, and 82b configured to detect a voltage between the electrode portions 76 and 77, and further includes connection terminals 83 and 84 that are coupled to the electrodes 6 and 7. The voltage detecting portions 81a, 81b, 82a and 82b are arranged at both end-portion sides of the bridge structure 70. In the embodiment shown in FIG. 9, the voltage detecting portions 81a and 81b and the connection terminal 83 are formed in the electrode portion 76, and the voltage detecting portions 82a and 82b and the connection terminal 84 are formed in the electrode portion 77.

The voltage detecting portions 81a, 81b, 82a, and 82b may be voltage detection terminals. The voltage is detected by means of coupling a conductor (e.g., aluminum wire) to each of these voltage detection portions 81a. 81b, 82a, and 82b, or means of inserting the voltage detecting portions 81a. 81b, 82a, and 82b as the voltage detection terminals into through-holes formed in a circuit board to electrically connect with wires formed on the circuit board.

As shown in FIG. 9, the bridge structure 70 includes slit portions 95, 96, 97, and 98. The slit portion 95 is formed between the voltage detecting portion 81a and the connection terminal 83, and the slit portion 96 is formed between the voltage detecting portion 81b and the connection terminal 83. The slit portion 97 is formed between the voltage detecting portion 82a and the connection terminal 84, and the slit portion 98 is formed between the voltage detecting portion 82b and the connection terminal 84.

Figure 10:
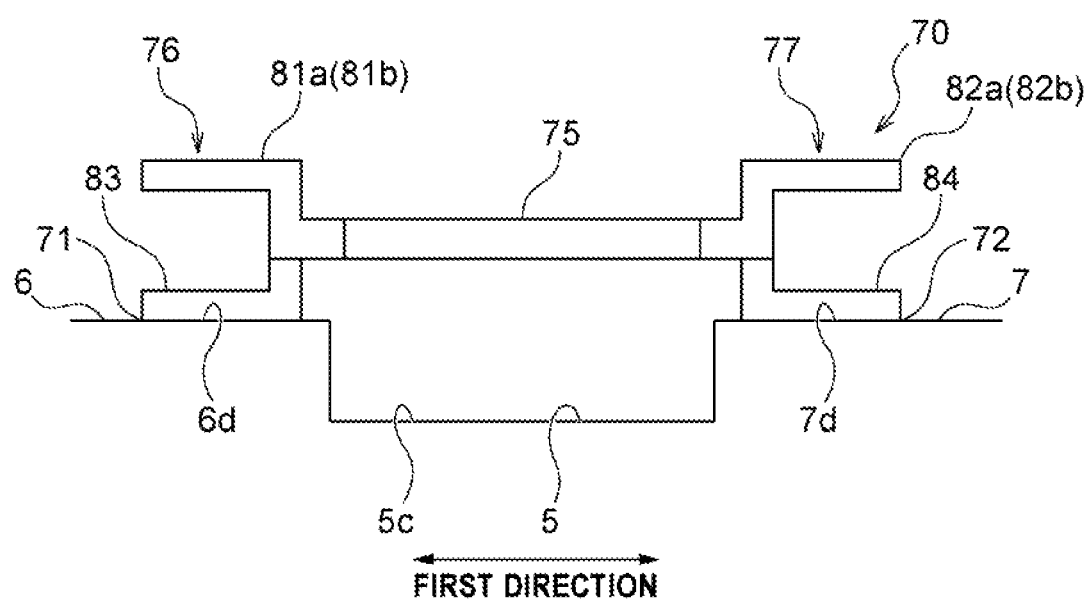
FIG. 10 is a side view of the bridge structure shown in FIG. 9.

FIG. 10 is a side view of the bridge structure shown in FIG. 9. As shown in FIG. 10, the voltage detecting portion 81a (81b) and the voltage detecting portion 82a (82b) are arranged in a direction away from the electrodes 6 and 7 and are not in contact with the electrodes 6 and 7. In one embodiment, the voltage detecting portion 81a (81b) and the voltage detecting portion 82a (82b) do not necessarily have to be arranged in the direction away from the electrodes 6 and 7 as long as the voltage detecting portion 81a (81b) and the voltage detecting portion 82a (82b) are not in contact with the electrodes 6 and 7. For example, the voltage detecting portion 81a (81b) and the voltage detecting portion 82a (82b) may extend in a horizontal direction.

In the embodiment shown in FIGS. 9 and 10, the electrode portions 76 and 77 have base end portions 85 and 86 next to the resistance portion 75. The voltage detecting portions 81a, 81b, 82a, and 82b and the connection terminals 83 and 84 are coupled to the base end portions 85 and 86. In one embodiment, the voltage detecting portions 81a, 81b, 82a, and 82b may be individual elements different from the electrode portions 76 and 77. In this case, the voltage detecting portions 81a, 81b, 82a, and 82b may be arranged next to the connection terminals 83 and 84.

In this embodiment, the electrode portion 76 includes two voltage detecting portions 81a and 81b, and the electrode portion 77 includes two voltage detecting portions 82a and 82b. In one embodiment, each of the electrode portions 76 and 77 may include a single terminal portion.

FIGS. 11A to 11C are diagrams showing examples of methods of determining a detected voltage value. As shown in FIG. 11A, when the electrode portion 76 includes the voltage detecting portions 81a and 81b and the electrode portion 77 includes the voltage detecting portions 82a and 82b, voltage values, which are a combination of a voltage value V1 detected between the voltage detecting portion 81a and the voltage detecting portion 82a and a voltage value V2 detected between the voltage detecting portion 81b and the voltage detecting portion 82b, may be averaged, and the averaged voltage value Vav may be determined to be a detected voltage value. In this way, the voltage values of the voltage detecting portions arranged along the second direction of the shunt resistor 1 may be detected, and the average value of the detected voltage values may be determined to be the detected voltage value.

In one embodiment, as shown in FIG. 11B, voltage values, which are a combination of a voltage value V1 detected between the voltage detecting portion 81a and the voltage detecting portion 82b and a voltage value V2 detected between the voltage detecting portion 82a and the voltage detecting portion 81b, may be averaged, and the averaged voltage value Vav may be determined to be a detected voltage value. In this way, the voltage values of the voltage detecting portions arranged diagonally in the second direction of the shunt resistor 1 may be detected, and the average value of the detected voltage values may be determined to be the detected voltage value.

In one embodiment, as shown in FIG. 11C, the voltage detecting portion 81a and the voltage detecting portion 81b may be electrically connected, and the voltage detecting portion 82a and the voltage detecting portion 82b may be electrically connected. A voltage value V1 detected between the mutually coupled voltage detecting portions 81a and 81b and the mutually coupled voltage detecting portions 82a and 82b may be determined to be a detected voltage value.

According to the methods of determining the detected voltage value as shown in FIGS. 11A to 11C, the shunt resistor 1 detects the voltages at a plurality of points from the same electrode side, so that the shunt resistor 1 has redundancy. The shunt resistor 1 changes potential distribution of the electrodes 6 and 7 depending on a direction (current path) in which the wiring members (e.g., bus bars) are coupled. The methods of determining the detected voltage value as shown in FIGS. 11A to 11C can reduce effect of changes in the potential distribution on the temperature coefficient of resistance (TCR), and the wiring members (e.g., bus bars) can be coupled without limiting connection methods.

Although not shown, the shunt resistor 1 according to the embodiments shown in FIGS. 4 and 6 may detect voltages at a plurality of points from the same electrode side as with the embodiments shown in FIGS. 11A to 11C. The embodiments shown in FIGS. 4 and 6 can also achieve the same effect as those of the embodiments shown in FIGS. 11A to 11C.

When each of the electrode portions 76 and 77 has a single voltage detecting portion, a voltage value detected between these voltage detecting portions may be determined to be a detected voltage value.

Figure 12:
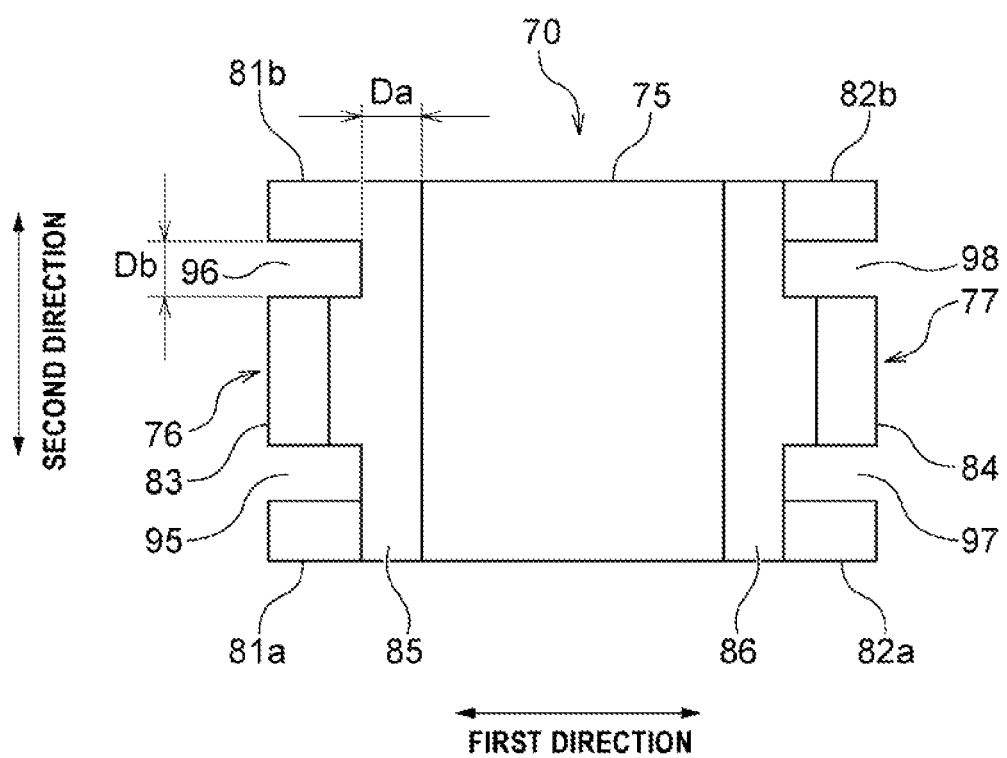
FIG. 12 is a diagram showing dimensions of slit portions formed in the bridge structure.
Figure 13:
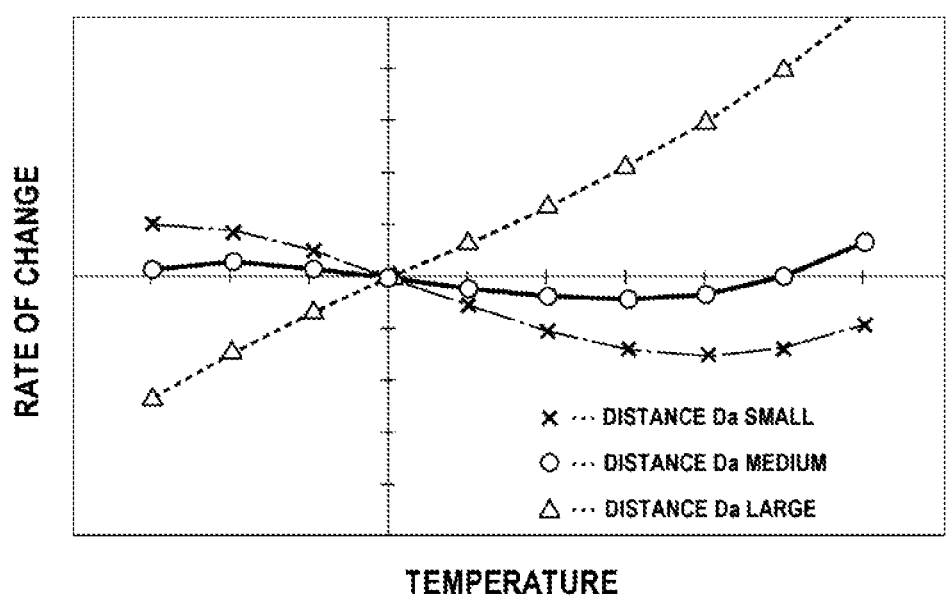
FIG. 13 is a graph showing temperature coefficients of resistance adjusted by changing the dimensions of the slit portions.

FIG. 12 is a diagram showing dimensions of the slit portions formed in the bridge structure. FIG. 13 is a graph showing temperature coefficients of resistance adjusted by changing the dimensions of the slit portions. As shown in FIGS. 12 and 13, the temperature coefficient of resistance of the shunt resistor 1 can be adjusted by changing size(s) of the slit portion 96 (and the slit portions 95, 97, and 98).

The slit portions 95, 96, 97, and 98 have the same structure, and the dimensions of all the slit portions 95, 96, 97, and 98 can be changed. Therefore, the configuration for changing the slit portion 96 will be described below. As shown in FIG. 12, a length of the slit portion 96 in the first direction can be changed by changing a distance Da of the base end portion 85 in the first direction. A length of the slit portion 96 in the second direction can be changed by changing a distance Db between the voltage detecting portion 81b and the connection terminal 83. The distance Da is related to a depth of the slit portion and represents a distance between a depth bottom of the slit portion and the resistance portion 75.

The graph shown in FIG. 13 shows the temperature coefficients of resistance of the shunt resistor 1 when the distance Da is changed. As shown in FIG. 13, when the distance Da is large (the depth of the slit portion is shallow), a relationship between a temperature and a rate of change is represented by an upward-sloping curve (i.e., a positive temperature coefficient of resistance). When the distance Da is small (the depth of the slit portion is deep), the relationship between the temperature and the rate of change is represented by a downward-sloping curve (i.e., a negative temperature coefficient of resistance). Therefore, the slope of the curve representing the temperature coefficient of resistance can be adjusted by changing the distance Da (depth of the slit portion). The slope of the curve representing the temperature coefficient of resistance can also be adjusted by changing the distance Db (a width of the slit portion). When the distance Db is decreased, the temperature coefficient of resistance can be adjusted to a positive side, and when the distance Db is increased, the temperature coefficient of resistance can be adjusted to a negative side.

In the embodiment shown in FIG. 12, the configurations for adjusting the temperature coefficient of resistance of the shunt resistor 1 by changing the size of the slit portion 96 has been described, while in one embodiment, the temperature coefficient of resistance of the shunt resistor 1 can be adjusted by changing a mounting position of the bridge structure 70, a shape of the shunt resistor 1 (e.g., lengths, widths, thicknesses, etc. of the electrodes 6 and 7 and the resistance element 5), or the material of the resistance element 5.

Figure 14A:
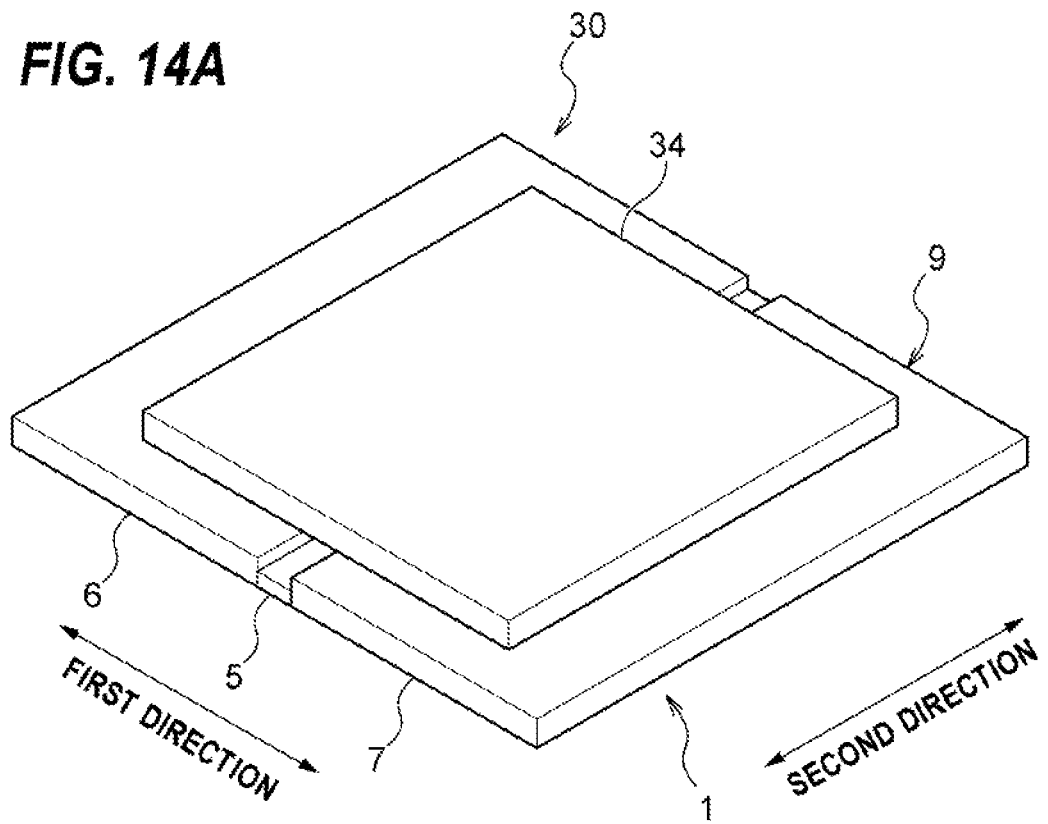
FIG. 14A is a diagram showing a current detection apparatus.
Figure 14B:
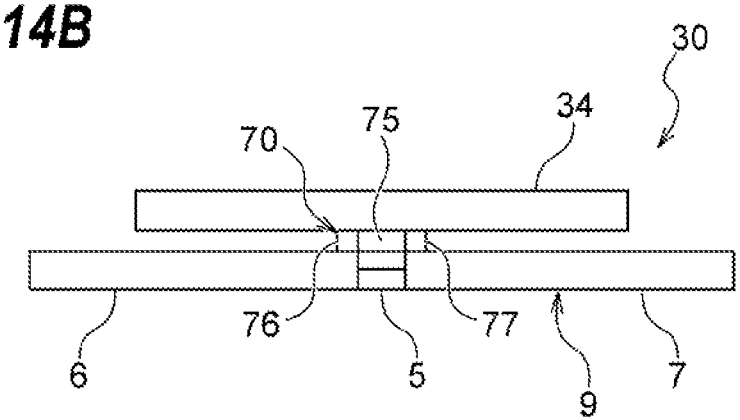
FIG. 14B is a side view of the current detection apparatus shown in FIG. 14A.
Figure 15:
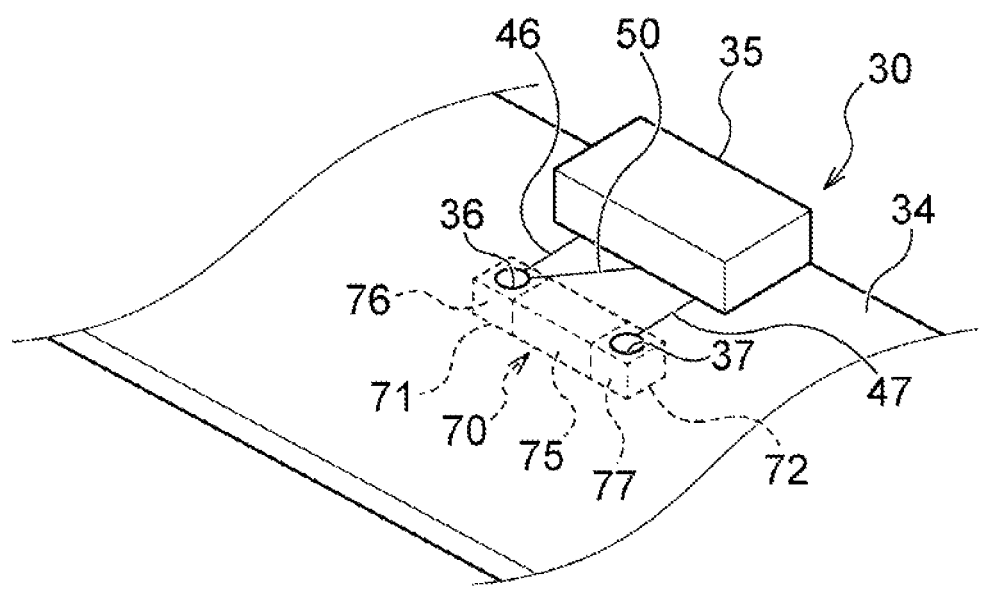
FIG. 15 is a diagram showing a current-detecting circuit board having voltage signal wires.

FIG. 14A is a diagram showing a current detection apparatus, and FIG. 14B is a side view of the current detection apparatus shown in FIG. 14A. FIG. 15 is a diagram showing a current-detecting circuit board having voltage signal wires. As shown in FIGS. 14A, 14B, and 15, the current detection apparatus 30 includes the shunt resistor 1 and a current-detecting circuit board 34. The current-detecting circuit board 34 is arranged on the shunt resistor 1.

As shown in FIG. 15, the current-detecting circuit board 34 includes voltage signal wires 46 and 47 configured to transmit a voltage signal from the shunt resistor 1 to an output connector (output terminal) 35, a ground wire 50, and voltage terminal pads (more specifically, copper foil portions) 36 and 37.

One end of the voltage signal wire 46 is coupled to the voltage terminal pad 36 and the other end of the voltage signal wire 46 is coupled to the output connector 35. The output connector 35 is an output terminal for outputting the voltage signal from the shunt resistor 1. One end of the voltage signal wire 47 is coupled to the voltage terminal pad 37 and the other end of the voltage signal wire 47 is coupled to the output connector 35. One end of the ground wire 50 is coupled to the voltage terminal pad 36 and the other end of the ground wire 50 is coupled to the output connector 35. In one embodiment, one end of the ground wire 50 may be coupled to the voltage terminal pad 37 and the other end of the ground wire 50 may be coupled to the output connector 35.

The voltage terminal pad 36 is electrically connected to the electrode portion (i.e., the voltage detecting portion) 76 via an internal wire (not shown) of the current-detecting circuit board 34. The voltage terminal pad 37 is electrically connected to the electrode portion (i.e., the voltage detecting portion) 77 via an internal wire (not shown) of the current-detecting circuit board 34.

The internal wires and the electrode portions (i.e., the voltage detecting portions) 76 and 77 are coupled by soldering or other means. In one embodiment, voltage detection terminals (vertically-extending conductive pins) are provided on the electrode portions (i.e., the voltage detecting portions) 76 and 77 by soldering or other means, and the internal wires and the electrode portions 76 and 77 are coupled by coupling conductive wires (e.g., aluminum wires) to the voltage detection terminals or by inserting the voltage detection terminals into through-holes formed in the circuit board.

An operator connects a cable having a connector that fits to the output connector 35 and measures a voltage between the electrode portions (i.e., the voltage detecting portions) 76 and 77. With such a configuration, the voltage between the electrode portions (i.e., the voltage detecting portions) 76 and 77 can be easily measured. In one embodiment, an operational amplifier (amplifier) for amplifying the voltage signal from the shunt resistor 1, an A/D converter, and/or a temperature sensor, etc. may be mounted to the current-detecting circuit board 34.

Figure 16A:
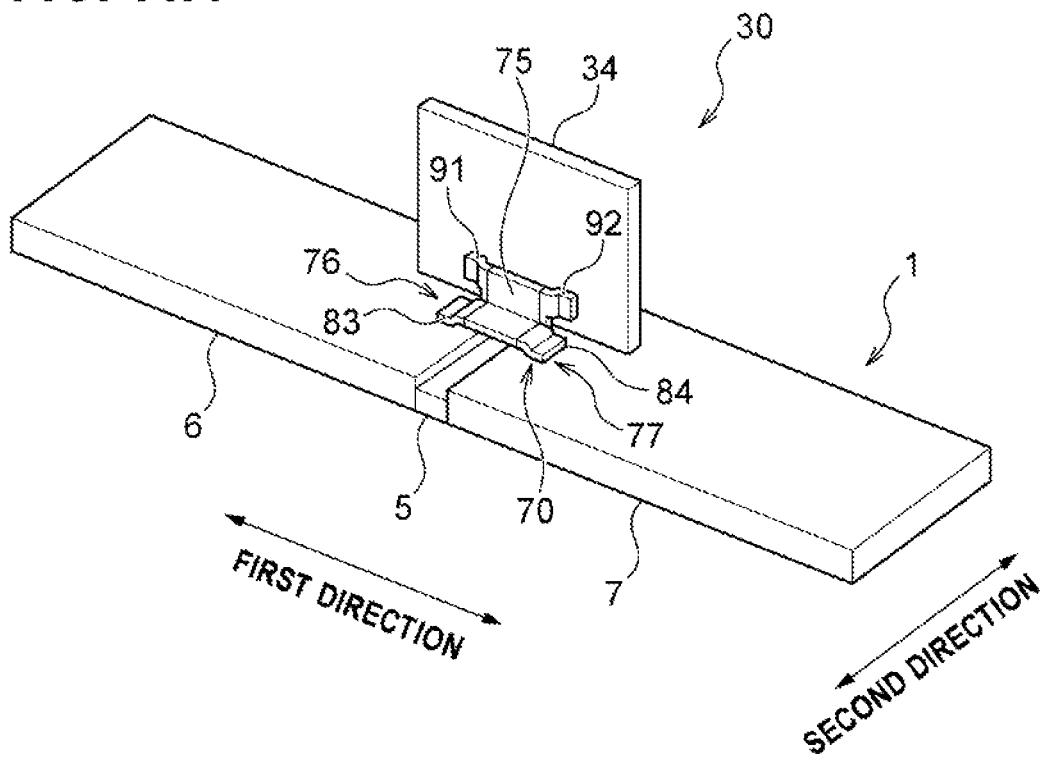
FIG. 16A is a diagram showing a current-detecting circuit board attached to the shunt resistor via the bridge structure.
Figure 16B:
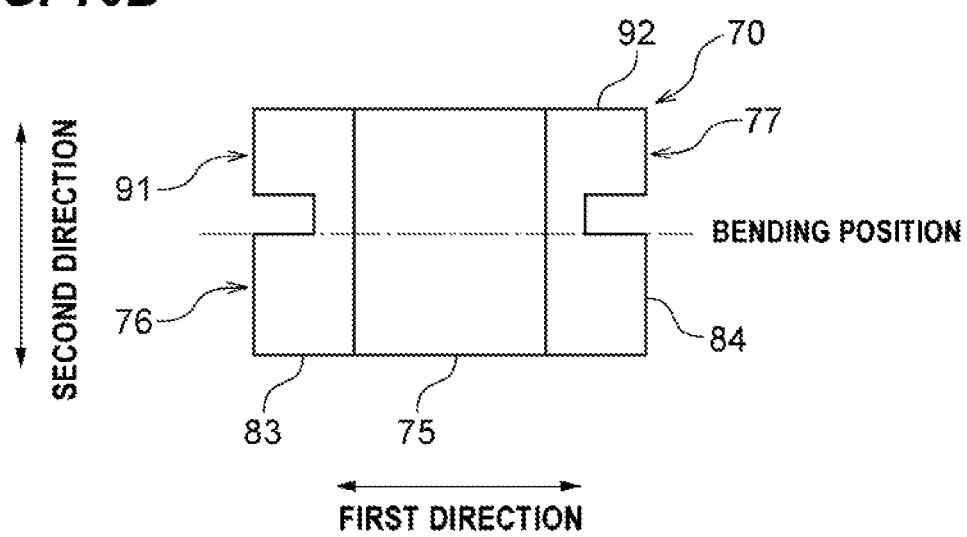
FIG. 16B is a diagram showing a bending position of the bridge structure.

FIG. 16A is a diagram showing a current-detecting circuit board attached to the shunt resistor via the bridge structure, and FIG. 16B is a diagram showing a bending position of the bridge structure. In this embodiment, the bridge structure 70 is bent at its central portion in the second direction of the shunt resistor 1, and has an L-shape. The bridge structure 70 includes connection terminals 83 and 84 that are coupled to the electrodes 6 and 7 and voltage detecting portions 91 and 92 that are coupled to the current-detecting circuit board 34. The voltage detecting portion 91 is formed in the electrode portion 76 and the voltage detecting portion 92 is formed in the electrode portion 77.

As shown in FIG. 16A, since the bridge structure 70 is bent at a right angle, the shunt resistor 1 coupled to the connection terminals 83 and 84 is perpendicular to the current-detecting circuit board 34 coupled to the voltage detecting portions 91 and 92. The voltage detecting portions 91 and 92 and voltage terminal pads (not shown) provided on the current-detecting circuit board 34 are coupled by soldering or other means.

Figure 17:
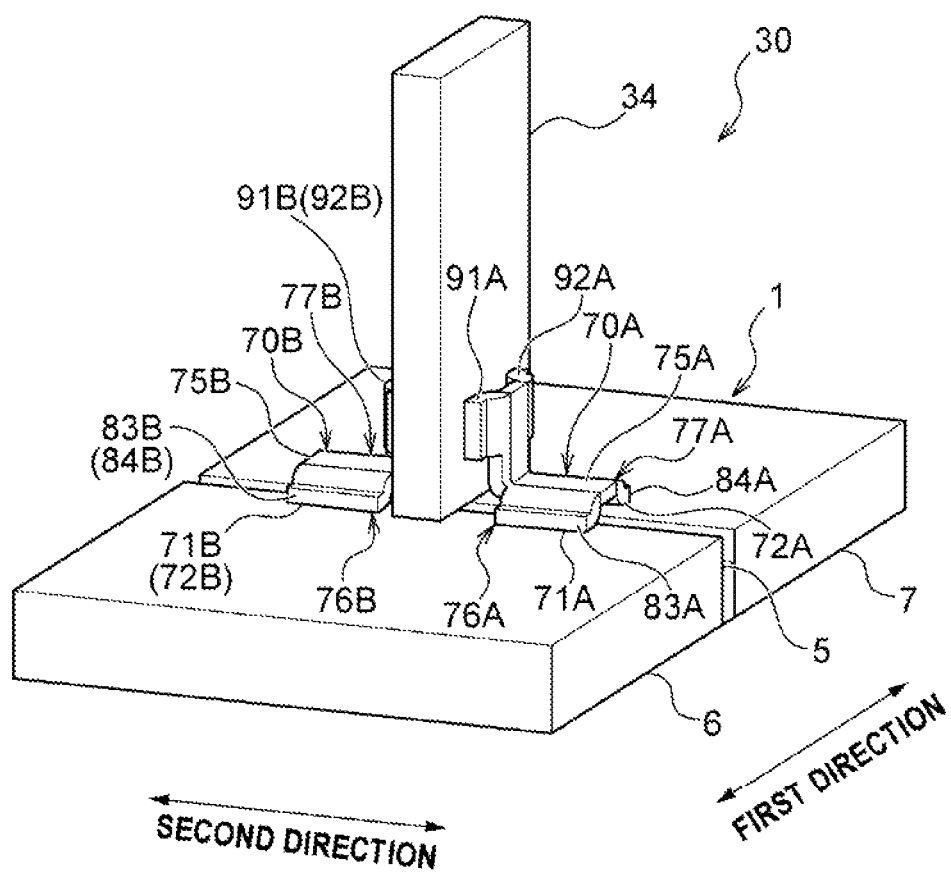
FIG. 17 shows a current-detecting circuit board attached to the shunt resistor via two bridge structures.

FIG. 17 is a diagram showing a current-detecting circuit board attached to the shunt resistor via two bridge structures. As shown in FIG. 17, the shunt resistor 1 includes bridge structures 70A and 70B, and the current-detecting circuit board 34 is attached to the shunt resistor 1 such that the current-detecting circuit board 34 is sandwiched between the bridge structures 70A and 70B facing each other. In this state, the current-detecting circuit board 34 and the shunt resistor 1 are perpendicular to each other.

As shown in FIG. 17, the bridge structure 70A includes a resistance portion 75A, electrode portions 76A and 77A, connection terminals 83A and 84A coupled to the shunt resistor 1, and voltage detecting portions 91A and 92A coupled to the current-detecting circuit board 34. Similarly, the bridge structure 70B includes a resistance portion 75B, electrode portions 76B and 77B, connection terminals 83B and 84B coupled to the shunt resistor 1, and voltage detecting portions 91B and 92B coupled to the current-detecting circuit board 34. The voltage detecting portions 91A, 91B, 92A, and 92B and voltage terminal pads (not shown) provided on the circuit board 34 are coupled by soldering or other means.

Figure 18:
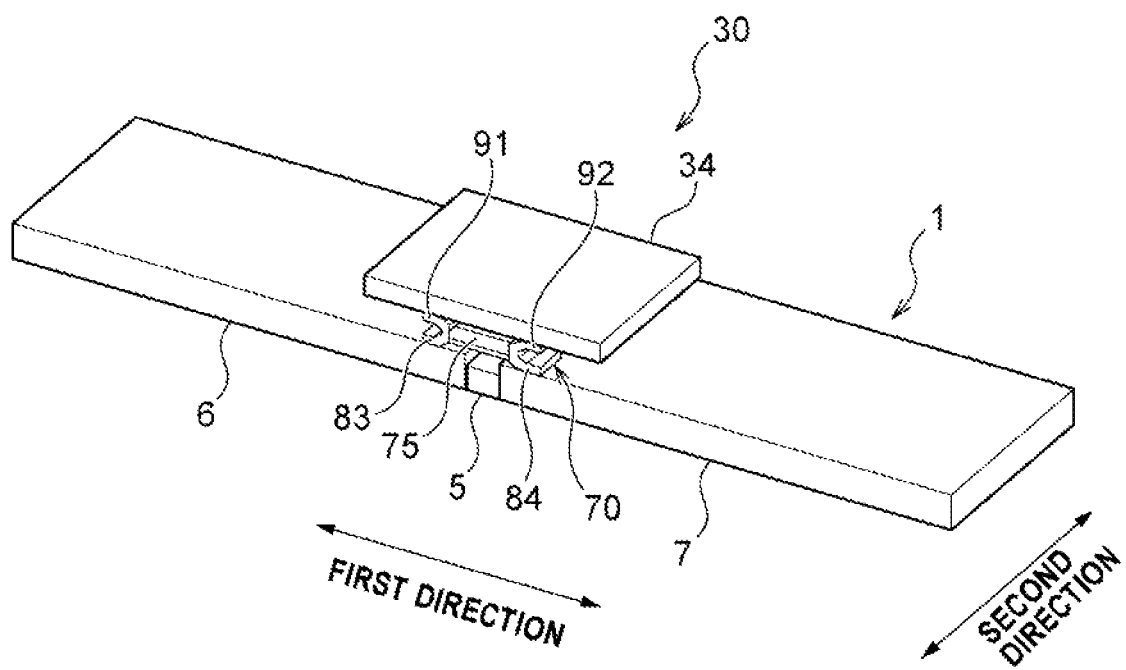
FIG. 18 is a diagram showing a current-detecting circuit board attached to the shunt resistor via a bridge structure bent into a U-shape.

FIG. 18 is a diagram showing a current-detecting circuit board attached to the shunt resistor via a bridge structure bent into a U-shape. As shown in FIG. 18, the bridge structure 70 is bent in a U-shape, and the current-detecting circuit board 34 coupled to voltage detecting portions 91 and 92 of the bridge structure 70 is arranged above the shunt resistor 1. The voltage detecting portions 91 and 92 and voltage terminal pads (not shown) provided on the current-detecting circuit board 34 are coupled by soldering or other means.

According to the embodiments shown in FIGS. 16 to 18, a degree of freedom in layout of the current-detecting circuit board 34 can be improved by means of bending the plate-shaped bridge structure 70 in the second direction (i.e., a direction perpendicular to a length direction of the resistance element 5) and attaching the current-detecting circuit board 34 or by means of arranging the plurality of bridge structures 70 and attaching the current-detecting circuit board 34. In one embodiment, the plate-shaped bridge structure 70 may be bent in the first direction (i.e., the length direction of the resistance element 5).

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claim.

What is claimed is:

1. A shunt resistor for use in current detection, comprising:
a base structure including a resistance element and a pair of electrodes coupled to both ends of the resistance element;
a bridge structure configured to bridge the pair of electrodes and made of a conductor; and
connections configured to couple the pair of electrodes to the bridge structure,
wherein the bridge structure has a higher resistance than a resistance of the base structure at the connections, and
wherein the bridge structure includes voltage detecting portions arranged at both end-portion sides of the bridge structure.

2. The shunt resistor according to claim 1, wherein the bridge structure has a smaller size than a size of the base structure.

3. The shunt resistor according to claim 1, wherein the connections are arranged along joint portions between the pair of electrodes and the resistance element.

4. The shunt resistor according to claim 1, wherein the bridge structure includes slit portions arranged between the connections and the voltage detecting portions.

5. The shunt resistor according to claim 1, wherein the voltage detecting portions are arranged next to the connections.

6. The shunt resistor according to claim 1, wherein the bridge structure has a plate shape and is bent in a direction perpendicular to a length direction of the resistance element.

7. A current detection apparatus comprising:
the shunt resistor according to claim 1; and
a current-detecting circuit board having a voltage signal wire configured to transmit a voltage signal from the shunt resistor,
wherein
the current-detecting circuit board includes voltage terminal pads coupled to the voltage detecting portions.

* * * * *